(12) United States Patent
Suzuki et al.

(10) Patent No.: US 8,535,101 B2
(45) Date of Patent: Sep. 17, 2013

(54) SOCKET FOR A SEMICONDUCTOR DEVICE

(75) Inventors: Katsumi Suzuki, Tokyo (JP); Takeyuki Suzuki, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 84 days.

(21) Appl. No.: 13/227,035

(22) Filed: Sep. 7, 2011

(65) Prior Publication Data

US 2012/0115366 A1 May 10, 2012

(30) Foreign Application Priority Data

Nov. 4, 2010 (JP) ................................. 2010-247777

(51) Int. Cl.
*H01R 24/00* (2011.01)
(52) U.S. Cl.
USPC ................................................ 439/626
(58) Field of Classification Search
USPC .................. 439/626, 607.02–607.05
See application file for complete search history.

(56) References Cited

U.S. PATENT DOCUMENTS

| | | | | |
|---|---|---|---|---|
| 4,734,046 A | * | 3/1988 | McAllister et al. | 439/101 |
| 6,967,557 B2 | * | 11/2005 | Hagios et al. | 336/200 |
| 6,992,496 B2 | * | 1/2006 | Winter et al. | 324/750.25 |
| 7,335,057 B2 | * | 2/2008 | Miller et al. | 439/578 |
| 7,362,114 B2 | * | 4/2008 | Winter et al. | 324/756.02 |
| 7,470,149 B2 | | 12/2008 | Kazama et al. | |
| 7,699,616 B2 | * | 4/2010 | Miller et al. | 439/45 |
| 7,785,147 B2 | * | 8/2010 | Nakayama et al. | 439/607.05 |
| 7,869,974 B2 | * | 1/2011 | Plishner | 702/108 |
| 7,950,927 B2 | * | 5/2011 | Kazama et al. | 439/66 |
| 2004/0253874 A1 | * | 12/2004 | Plishner | 439/620 |
| 2011/0246014 A1 | * | 10/2011 | Sauper | 701/22 |

FOREIGN PATENT DOCUMENTS

JP   A-2005-156530   6/2005

* cited by examiner

*Primary Examiner* — Amy Cohen Johnson
*Assistant Examiner* — Vladimir Imas
(74) *Attorney, Agent, or Firm* — Oliff & Berridge, PLC

(57) ABSTRACT

A device, wherein, at cells 10*ai* of a metallic upper housing 10 corresponding to a signal line, between an end portion of an adapter 24 that has electrically insulating properties the inner surface of an upper housing 12 that has electrically insulating properties, an annular air layer Ai is formed at the peripheries of sleeves 20S of contact terminals 20*ai* that have the same structure as each other, and wherein, at the cells 10*ai* that correspond to ground lines, contact points 20CT2 of the contact terminals 20*ai* are inserted in through-holes 12*ai* of the lower housing 12, and their contact points 20CT1 are inserted into small diameter holes 22*b* of conductive collars 22 that touch the inner surfaces of the cells 10*ai*.

7 Claims, 14 Drawing Sheets

SOCKET FOR A SEMICONDUCTOR DEVICE

CROSS-REFERENCE TO RELATED APPLICATIONS

This application claims the benefit of Japanese Patent Application No. 2010-247777, filed Nov. 4, 2010, which is hereby incorporated by reference herein in its entirety.

BACKGROUND OF THE INVENTION

1. Field of the Invention

The present invention relates to a socket for a semiconductor device.

2. Description of the Related Art

In semiconductor devices that serve as electronic apparatuses mounted in electronics equipment, testing in order to eliminate latent defects at a stage before mounting is generally carried out via a semiconductor device socket. Semiconductor device sockets that are used in such tests, and that are provided for mounting, are generally referred to as IC sockets, and are disposed on printed circuited boards (test boards or boards for actual mounting), such as those shown in Japanese Patent Laid-Open No. 2005-156530, for example.

In the case where a semiconductor device socket is provided in a transmission path where a RF signal of a comparatively high, for example 1 GHz or greater, frequency band, is transmitted, it is known that transmission performance of signals of a comparatively high frequency band is raised by way of minimizing the length between the contact points of the movable terminal parts of the contact terminals and the base of their soldered fixation terminals, and decreasing impedance, along with implementing impedance matching in order to raise the transmission characteristics of the comparatively high frequency band at the IC socket.

And, with respect to IC sockets, as illustrated at FIG. 9 of Japanese Patent Laid-Open No. 2005-156530, for example, a device is proposed that is configured to include a holder substrate, which comprises a first substrate and a second substrate that are superimposed with respect to each other, and a plurality of contacts that are received in the respective openings inside the first substrate and the second substrate.

In the configuration above the holder substrate is made from a conductive material which has been subjected to surface processing. And contacts for each signal line that comprise so-called spring probes, etc., are separately received through an insulating pipe member into respective openings that correspond to prescribed signal lines of a semiconductor device serving as a testing object and that penetrate through the thickness direction of the holder substrate, for example.

Accordingly, the impedance of signal lines that transmit high frequency electric signals is adjusted to a prescribed value, along with attenuation of the transmitted signal being restrained because it is possible to increase the outer diameter of the contacts for the respective signal lines. In doing so, respective openings are formed that correspond to prescribed ground lines and power-supply lines of the semiconductor device, at locations that are adjacent to the respective openings in which each of the signal contacts are received, with prescribed spaces therebetween. Contacts, for earthing, which have maximum diameters greater than the maximum diameters of the signal contacts, and contacts, for feeding, which have diameters that are the same as the diameters of the signal contacts, are received inside respective openings.

Earthing contact terminals are received inside openings through conductive pipe members. And feeding contacts are received inside openings through insulating pipe members.

As mentioned above, the maximum diameters of earthing contacts are set large in comparison to the maximum diameters of signal contacts and feeding contacts.

Furthermore, as shown at FIGS. 2 and 8 of Japanese Patent Laid-Open No. 2005-156530, a device is proposed in which only signal, earthing and feeding contacts that have the same diameter as each other are received in respective openings. And also, a device is proposed wherein a signal contact, an earthing contact and a feeding contact, which have the same diameter as each other, are each received in respective housings through an impedance adjusting member.

In the case where the impedances is mismatched it is desirable that the thicknesses of the first substrate and the second substrate be constructed as thin as possible. And, in the case where the quantity of contacts is increased in accordance with an increase in the number of electrodes at the electrode portion of the semiconductor device, it is desirable that the magnitudes of the flexural rigidities of the first substrate and the second substrate be set to a value such as not to decrease positional accuracy of the plurality of contacts and such that the first and second substrates do not warp.

SUMMARY OF THE INVENTION

Recently, with respect to semiconductor devices, there has been a trend towards electrode pitch on the electrode portion of semiconductor devices becoming narrow, and high densification of the electrode portions. Thus, along with the high densification of the electrode portions of semiconductor devices, there are cases where the quantity of contact terminals of IC sockets surpasses roughly 100 terminals, for example.

In such cases, as shown at Japanese Patent Laid-Open No. 2005-156530, in the case where signal, earthing and feeding contacts having the same diameter as each other, and are each received in openings through impedance adjusting members, because a common impedance adjusting member is used at the signal line, at the power-supply line and at the grounding line, high insulating and heat resisting properties are required in the material of the impedance adjusting member. There has been an increasing limitation in the number of suitable materials that can be selected. And, because the periphery of the earthing contact is surrounded by an insulating member, in the case where the holder substrate is made a conductive member, it is not possible to conduct the holder substrate to ground, and therefore there is a danger that regulation of impedance will become difficult.

And in the case where a general resin material, ceramic, etc., is used as the material of the common impedance adjusting member having an insulating property, the relative permittivity becomes higher and as a result it is not possible to make the set impedance value comparatively large. Furthermore, also in the case where hole diameter of the holder substrate through which the tips of the contacts pass, is set comparatively large in order to elevate current-carrying capacity of a power-supply line, it is not possible to make the set impedance value comparatively large.

Assuming a case in which the above mentioned set impedance value has become large, because it is not possible to make the alignment space between contacts narrower, a problem would be brought about wherein it would not be possible to cope with high densification at the electrode portion of the semiconductor device.

Furthermore, with respect to a configuration such as that shown at Japanese Patent Laid-Open No. 2005-156530, in the case where it is necessary to alter the arrangement of the signal contact, earthing contact and feeding contact of an IC socket, in connection with design changes pertaining to the signal line, ground line and power-supply line of the semiconductor device, because it is difficult to replace individual signal contacts, a problem arises wherein it is not possible to individually cope with changes of contact array.

In view of the above-described mentioned problem, the present invention aims to provide a socket for a semiconductor device. The socket for a semiconductor device can easily cope with narrowing of contact terminal alignment pitch, can implement impedance matching, and can also easily cope with changes in the alignment of individual contact terminals without substantial design changes, even in the case where the density of the electrodes of the semiconductor device has been made high.

In order to achieve the above object, a socket for a semiconductor device of the present invention comprises: (a) a plurality of contact terminals that have the same structure as each other and connect to signal lines and ground lines of a semiconductor device; (b) an upper housing that is made from a conductive material and that is provided with a contact terminal reception unit that has (i) a plurality of open ends through which the contact terminals pass and (ii) a plurality of contact terminal cells that form air layers that set the impedance at the peripheries of the contact terminals that correspond to the signal lines, when the contact terminals are separately received and the contact terminals that correspond to the signal lines are received; (c) a lower housing that is made from an electrically insulating material, is disposed in the upper housing such as to cover the open ends of the contact terminal reception unit, and which has holes that correspond to the contact terminal cells and into which ends of the contact terminals are inserted; and (d) conductive collar members that are disposed such as to touch the inner surface, between the outer surface of the contact terminals and the inner surfaces of the contact terminals cells, of the contact terminal cells corresponding to the ground lines.

According to a semiconductor socket connector of the present invention, a semiconductor socket connector is provided with a lower housing made from an electrically insulating material and an upper housing made from a conductive material, the upper housing has open ends through which contact terminals having the same configuration as each other pass, and has a contact terminal reception unit that has a plurality of contact terminal cells that individually receive contact terminals corresponding to at least a signal line and a ground line of a semiconductor device to which the contact terminals are connected, and even in the case where the density of the electrodes of the semiconductor device has been made high because the impedance at the contact terminal cells corresponding to signal lines has been set according to the volume of the air layers formed at the peripheries of the contact terminals, it is possible to easily handle narrowing of contact terminal alignment pitch, to implement impedance matching, as well as easily handle changes in the alignment of individual contact terminals without substantial design changes.

Further features of the present invention will become apparent from the following description of exemplary embodiments (with reference to the attached drawings).

DESCRIPTION OF THE EMBODIMENTS

Figure 3:
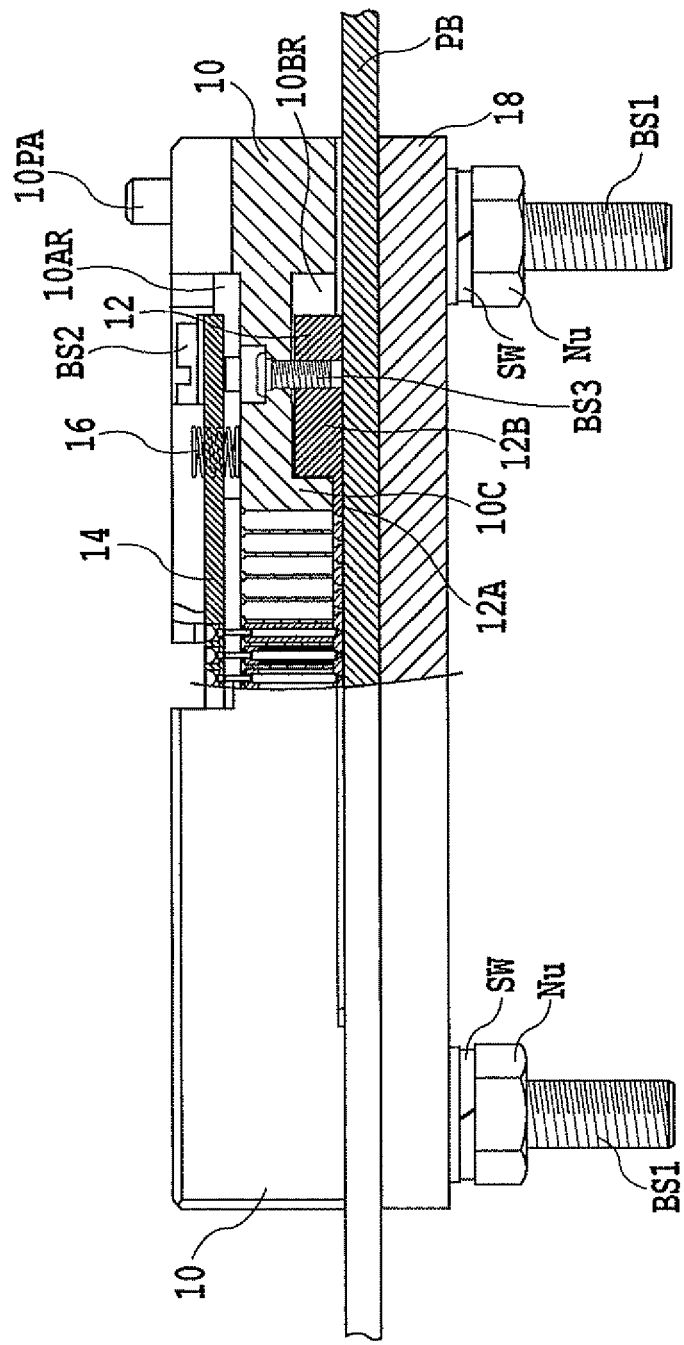
FIG. 3 is an exterior view that includes a partial cross sectional view along the line III-III shown in FIG. 4, illustrating main components of a semiconductor device socket of a first embodiment of the present invention.

FIG. 3 illustrates the main components of the socket, for a semiconductor device ("semiconductor device socket"), of a first embodiment of the present invention.

In FIG. 3 multiple semiconductor device sockets are, for example, disposed on a printed wiring board PB serving as a test board. Note that in FIG. 3 one semiconductor device socket of the printed wiring board PB is representatively illustrated.

The printed wiring board PB is, for example, made from glass epoxy resin, and has an electrode group (not shown), which is composed of multiple electrode pads that are formed into a grid pattern corresponding to the alignment of the later described contact terminals $20ai$, at roughly the central portion of one of its surfaces. Four through-holes, into which the later described screws BS1 are inserted, are formed at the perimeter.

The semiconductor device socket is configured to have as main elements an upper housing 10 and a lower housing 12 that cooperate with and accommodate contact terminals $20ai$ (i=1 to n, where n is a positive integer) therein, a positioning plate 14 that positions the respective electrodes DVa of the semiconductor device DV mounted with respect to the contact points of the respective contact terminals $20ai$ to be described later, and a reinforcing plate 18 disposed on the reverse side of the printed wiring board PB, the reinforcing plate that sandwiches the printed wire board PB in cooperation with the upper housing 10 and the lower housing 12. The upper housing 10 and the lower housing 12 are fixed on the printed wiring board PB by way of being fastened by the four machine screws BS1 mentioned above, and four nuts Nu and spring washers SW.

Figure 4:
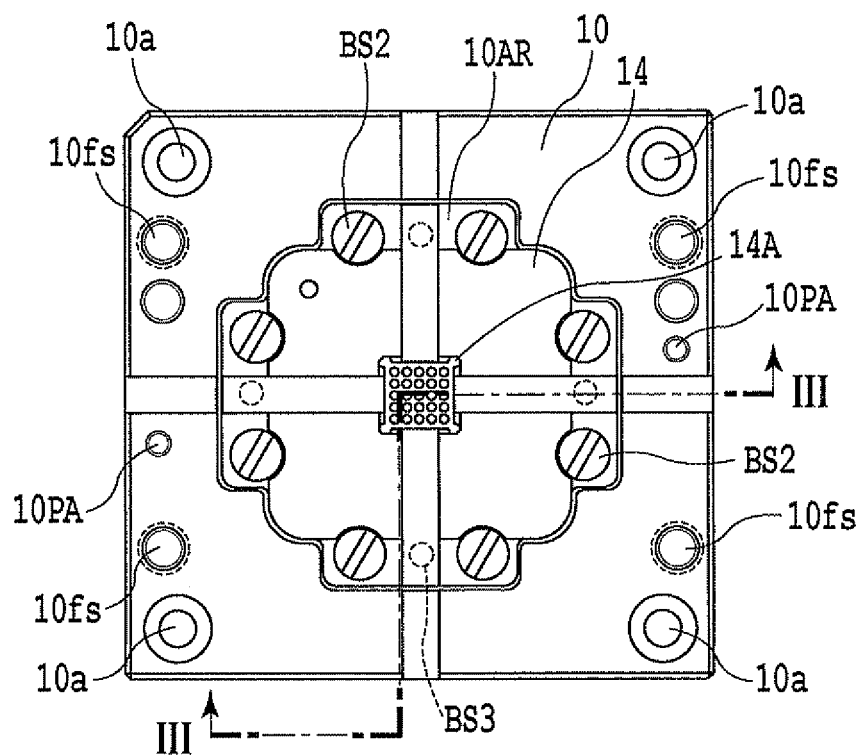
FIG. 4 is a plan view of the example shown in FIG. 3.

The upper housing 10 is made from a conductive metal such as a copper alloy, for example, or an aluminum alloy. The upper housing 10, as shown in FIG. 4, has a concave portion 10AR roughly at its center, in which the positioning plate 14 is disposed such as to be able to move up and down. At the locations of each of the four corners at the perimeter outside the concave portion 10AR, through-holes 10a are formed into which the machine screws BS1 are inserted. Between mutually facing pairs of through-holes 10a, crossing shallow channels are roughly formed into a cross shape, which channels are used when confirming, by a sensor, etc., whether the respective semiconductor devices DV are mounted in the later described semiconductor device mounting unit 14A. Between the channels and the through-holes 10a, female threaded holes 10fs, into which later described machine screws are screwed, are formed along one of the facing sides of the upper housing 10. Furthermore, positioning pins 10PA, which are fit into holes of the later described base member 30, are provided adjacent to the channels at one of the mutually facing sides of the upper housing 10.

The positioning plate 14 has, at its center, a semiconductor device mounting unit 14A in which a semiconductor device DV (refer to FIG. 5) is detachably mounted as an object to be tested. At the semiconductor device mounting unit 14A, positioning cavities 14Gi (i=1 to n, where n is a positive integer) are formed at a prescribed depth, as enlarged and shown in FIG. 1. At the portion forming the bottoms of each of the positioning cavities 14Gi, microscopic holes 14Gai (i=1 to n, where n is a positive integer) are formed, into which the contact points of the later described contact terminals 20ai are movably inserted.

Figure 8:
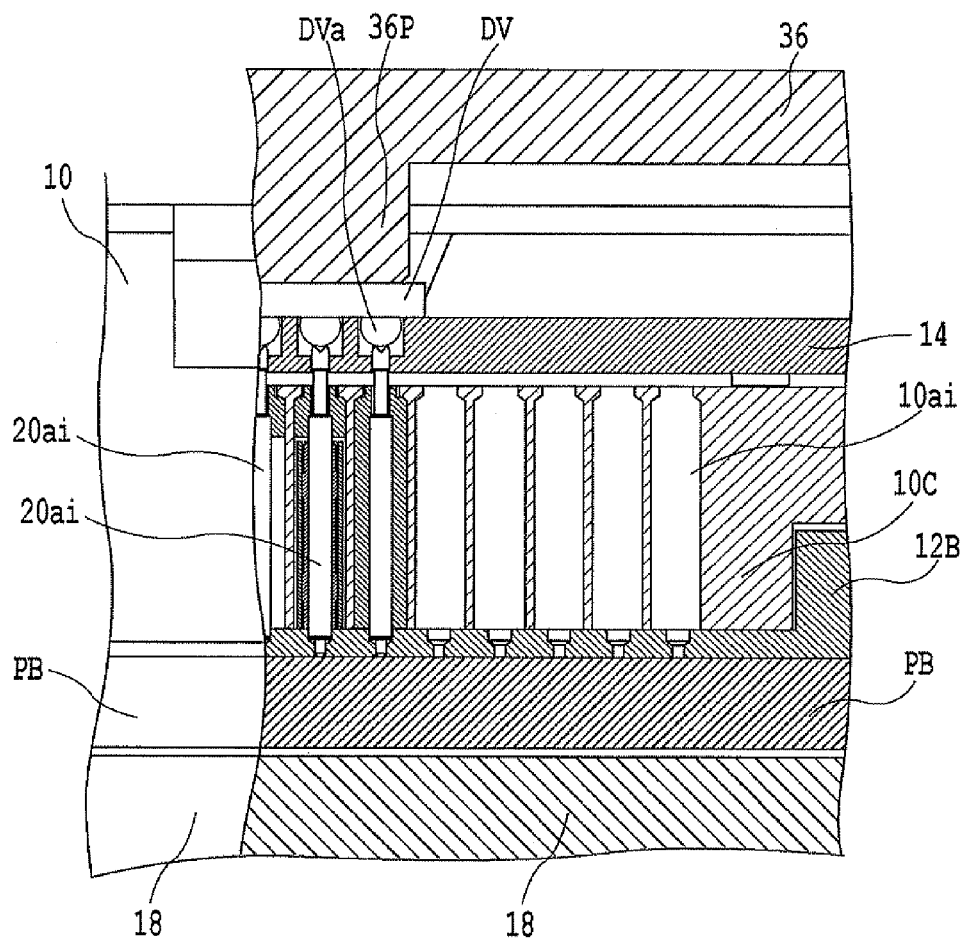
FIG. 8 is a partial cross sectional view with a part of FIG. 7 shown enlarged.

The semiconductor device DV is, for example, provided with an integrated circuit in a BGA type package. At the bottom of the semiconductor device DV multiple electrodes DVa are formed lengthwise and breadthwise (refer to FIGS. 1 and 8). When the semiconductor device DV is positioned at the semiconductor device mounting unit 14A, as enlarged and shown in FIG. 1, each of the electrodes DVa of the semiconductor device DV are inserted into each of the positioning cavities 14Gi (i=1 to n, where n is a positive integer) formed on the semiconductor device mounting unit 14A.

Between the fringe of the semiconductor device mounting unit 14A on the positioning plate 14, and the bottom that forms the concave portion 10AR of the upper housing, 4, for example, coil springs 16 that bias the positioning plate 14 in a direction away from the bottom are provided (refer to FIG. 3). The positioning plate 14 is maintained at a position that is at a prescribed height from the bottom that forms the concave portion 10AR, by way of multiple machine screws BS2 being screwed through holes of the positioning plate 14 into the female threaded holes of the upper housing 10. Accordingly, the positioning plate 14 is guided by the multiple machine screws BS2 and is supported such that it is able to move up and down.

Figure 5:
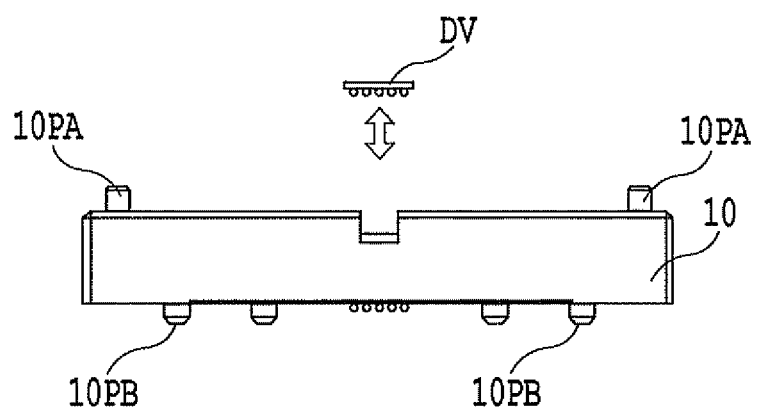
FIG. 5 is a front view showing the upper housing of the example illustrated in FIG. 3.

At the bottom that forms the perimeter of the contact terminal reception unit 10C of the upper housing 10 touching the surface of the printed wiring board PB, a concave portion 10BR is open, into which the connection portion of the lower housing 12 is inserted. As shown in FIG. 5, multiple positioning pins PB are formed, at a prescribed spacing, at the bottom that forms the perimeter of the concave portion BR of the upper housing 10.

The lower housing 12 is formed out of a resin material, for example, and is composed of a connection portion 12B that is inserted into the concave portion BR, and a contact terminal alignment portion 12A that continues into the connection portion 12B and touches the bottom of the contact terminal reception unit 10C of the upper housing 10.

The connection portion 12B of the lower housing 12 has a female threaded hole into which the machine screw BS3 is screwed. Accordingly, as shown in FIG. 3, the lower housing 12 is fixed to the upper housing 10 by way of the machine screw BS3 being screwed through the hole of the upper housing 10 into the female threaded hole of the lower housing 12.

Figure 1:
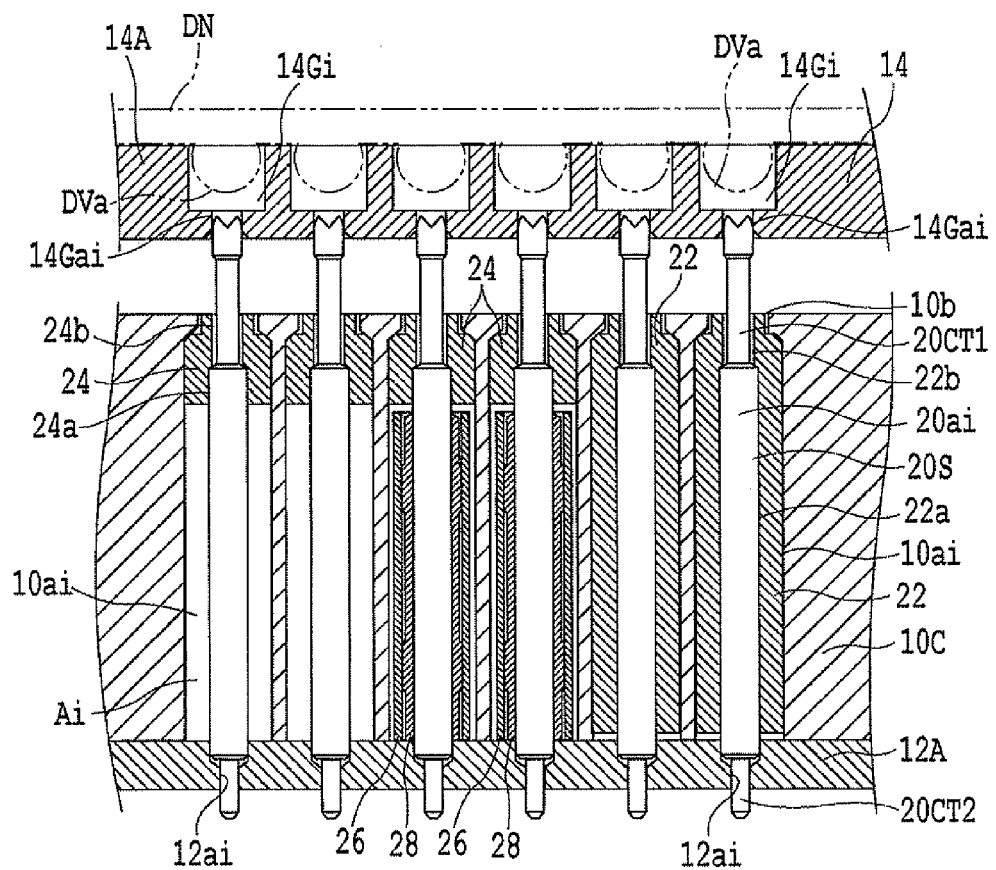
FIG. 1 is a partial cross sectional view that illustrates main components of a semiconductor device socket of a first embodiment of the present invention.

The contact terminal alignment portion 12A, as partially enlarged in FIG. 1, has through-holes 12ai (i=1 to n, where n is a positive integer) that correspond to the cells 10ai (i=1 to n, where n is a positive integer) of the contact terminal reception unit 10C. The through-holes 12ai are composed of a large diameter portion that receives and stops the end of the sleeve 20S of the contact terminal 20ai, and a small diameter portion that continues into the large diameter portion and through which the contact point 20CT of the contact terminal 20ai passes.

As enlarged in FIG. 1, the cells 10ai are formed lengthwise and breadthwise in the contact terminal reception unit 10C of the upper housing 10, at a prescribed distance corresponding to the electrodes DVa of the semiconductor device DV. The center axes of each of the cells 10ai extend in an approximately vertical direction with respect to the surface of the printed wiring board PB. The lower ends of the cells 10ai are open towards the contact terminal alignment portion 12A (the surface side of the printed wiring board PB), and the upper ends of the cells 10ai have microscopic holes 10b having a radius smaller than that of the middle portion. Each of the roughly cylinder shaped cells 10ai have the same structure as each other.

And the contact terminals 20ai received in each of the cells 10ai also have the same structure as each other.

The contact terminals 20ai are configured to include contact points 20CT1 that selectively touch the electrodes DVa of the semiconductor device DV, contact points 20CT2 that touch the contact pads of the printed wiring board PB, and sleeves 20S. The sleeves 20S receive coil springs (not shown) that bias the proximal ends of the contact points 200T1 and the proximal ends of the contact points 20CT2 in directions away from each other, and couple the contact points 20CT1 and contacts points 20CT2 such that they are capable of coming closer or and farther away from each other.

In FIG. 1, at the cells 10ai of the upper housing 10, the contact terminals 20ai comprise, in order from the left end, parts of the transmission paths of two signal lines, two power-supply lines, and two ground lines, for example.

Regarding the 2 signal lines, the contact points 20CT2 of the respective contact terminals 20ai are inserted into the through-holes 12ai of the lower housing 12, and their contact points 20CT1 are inserted into small diameter holes 24b of the adapters 24 serving as impedance adjusting members. Accordingly, in FIG. 1, the tips of the contact points 20CT1 are inserted through the large diameter holes 24a and the small diameter holes 24b of the later described adapters 24, into the microscopic holes 14Gai of the positioning cavities 14Gi of the positioning plate 14. On the other hand, as enlarged in FIG. 1, the tips of the contact points 20CT2, in the case where the upper housing 10 and the lower housing 12 are not fixed with respect to the printed wiring board P13, project a prescribed amount through the through-holes 12ai of the lower housing 12, towards the contact pads of the printed wiring board PB.

The adapter 24 is formed from an electrically insulated material, for example, a resin material, into a cylindrical shape, and has a portion with a different cross sectional diameter. The adapter 24 has, interiorly thereof, a small diameter hole 24b into which the contact point 20CT1 is inserted, and a large diameter hole 24a that is in communication with the small diameter hole 24b and into which an end of the sleeve 20S is fit. The outer circumference of the adapter 24 touches the inner surface of the cell 10ai, and has a stepped portion at its tip that fits into the microscopic hole 10b formed at the upper end of the cell 10ai. The length of the adapter 24 along its central axis is set to a prescribed length that can support the contact point 20CT1 of the contact terminal 20ai, and the end of the sleeve 20S.

At the cell 10ai that corresponds to a signal line, annular air layers Ai are formed around the perimeter of the sleeve 20S, between the end of the adapter 24 and the inner surface of the lower housing 12.

At the cell 10ai, the impedance value Zo at the adapter 24 is set to the value obtained by the following equation (1):

$$Zo=60(Er)^{-1/2}\log_e d1/d2 \qquad (1)$$

In equation (1) above Er is the relative permittivity of the resin material, d1 is the diameter of the large diameter hole 24a or the small diameter hole 24b, and d2 is the outer diameter of the adapter 24.

Regarding the cell 10ai, the impedance value Zo at the annular air layer Ai is calculated by substituting 1.0 as the Er value, and the value of the inner diameter of the cell 10ai and the value of the outer diameter of the sleeve 20S as d1 and d2, respectively, into equation 1.

Because the upper housing 10 is formed from a metallic material, the material properties of the adapter 24 are such that selection of materials that give priority to relative permittivity is possible, and thus simple adjustment of the impedance value is possible.

Regarding the two power-supply lines, the contact points 20CT2 of the respective contact terminals 20ai are inserted into the through-holes 12ai of the lower housing 12, and their contact points 20CT1 are inserted into small diameter holes 24b of the adapters 24 serving as impedance adjusting members. At the cell 10ai, a combination tube may be wound around the perimeter of the sleeve 20, between the end of the adapter 24 and the inner surface of the lower housing 12. A predetermined clearance is formed between the perimeter of the combination tube and the inner surface of the cell 10ai. The combination tube has an insulating tube 26, which is formed from an insulating material, etc., such as polyimide, Teflon (registered trademark), polyether ether ketone resin (PEEK), or liquid crystal polymer (LCP), that is fit to the outer perimeter of the conductive tube 28 formed from a conductive material such as Cu or Al.

It is possible to lower conductive material resistance and to elevate current-carrying capacity by way of providing a conductive sleeve 28 on pins that do not emphasize transmission characteristics, such as power pins, etc. It is possible to enhance insulation with respect to the upper housing 10 by covering the outer perimeter of the conductive tube 28 with the insulating tube 26. Note that instead of the insulating tube 26 an insulating film may be formed at the perimeter of the conductive tube 28.

Regarding the 2 ground lines, the contact points 20CT2 of the contact terminals 20ai are inserted into the through-holes 12ai of the lower housing 12, and their contact points 20CT1 are inserted into the small diameter holes 22b of the later described collars 22. Accordingly, in FIG. 1, the tips of the contact points 20CT1 are inserted through the small diameter holes 22b of the collars 22, into the microscopic holes 14Gai of the positioning cavities 14Gi of the positioning plate 14. On the other hand, as enlarged in FIG. 1, the tips of the contact points 20CT2, in the case where the upper housing 10 and the lower housing 12 are fixed with respect to the printed wiring board PB, project a prescribed distance through the through-holes 12ai of the lower housing 12, towards the contact pads of the printed wiring board PB.

The collar 22 is formed, for example, from a conductive metallic material into a cylindrical shape, and has a portion with a differing cross sectional diameter. The collar 22 has, interiorly thereof, a small diameter hole 22b into which the contact point 20CT1 is inserted, and a large diameter hole 22a that is in communication with the small diameter hole 22b and into which an end of the sleeve 20S is fit. The outer circumference of the collar 22 touches the inner surface of the cell 10ai, and has a stepped portion at its tip that fits into the microscopic hole 10b formed at the upper end of the cell 10ai. The length of the collar 22 along its central axis is longer than the length of the adapter 24, and is set to a prescribed length such as to come close to the inner face of the lower housing 12.

With respect to the above configuration, in the case where the upper housing 10 and the lower housing 12 that accommodate each of the contact terminals 20ai are fixed with respect to the printed wiring board PB, the contact points 20CT2 are pushed into the sleeves 20S by way of the tips of the contact points 20CT2 of each of the contact terminals 20ai touching the contact pads of the printed wiring board PB. Accordingly, because the resultant counteractive force caused by the coil springs of each of the contact terminals 20ai is received at the entire body of the upper housing 10, there is no fear that warping of the upper housing 10 will occur due to the resultant counteractive force caused by the coil springs, and the positional accuracy of each of the contact terminals 20ai is maintained at a comparatively high precision.

Figure 6:
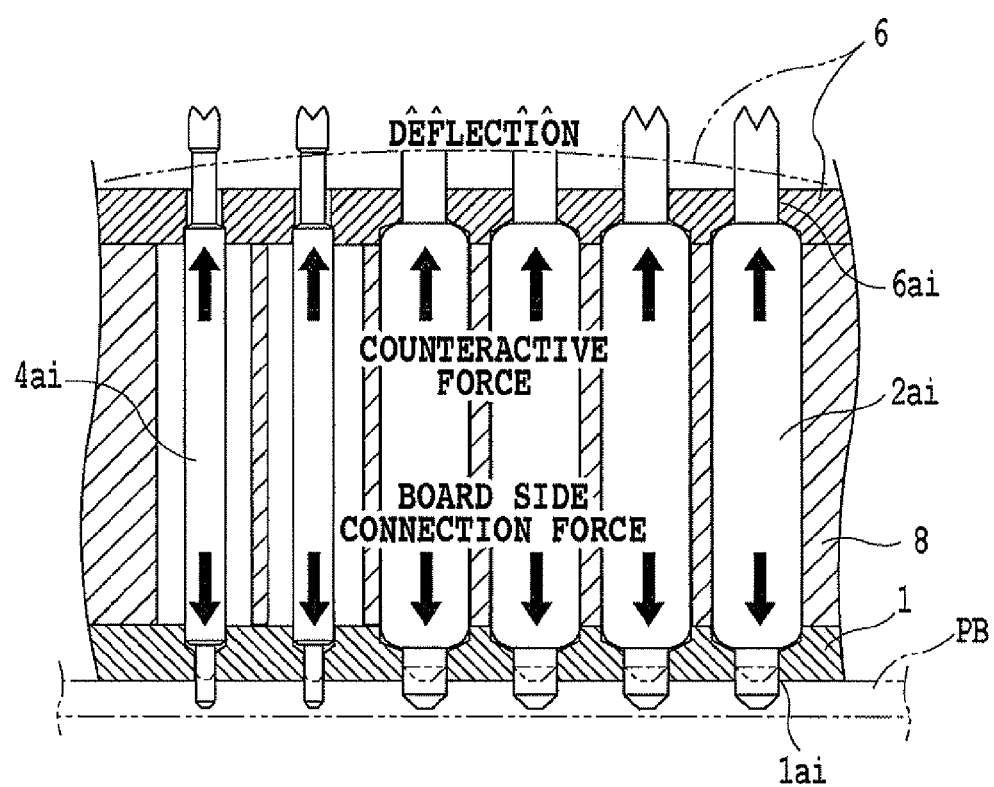
FIG. 6 is a partial cross sectional view illustrating main components of a comparative example.

On the other hand, as shown in FIG. 6 for example, there are cases where the multiple contact terminals 2ai and 4ai, serving as spring probes, are accommodated by a housing that comprises an upper support plate 6 that has multiple through-holes 6ai and a lower support 1 plate that has multiple through-holes 1ai, and an intermediate member 8 that has cylindrical cells lengthwise and breadthwise. The upper support plate 6 and the lower support plate 1 are each made of a resin material and are formed comparatively thin, and the intermediate member 8 is formed of a conductive material.

In such case, when the upper support plate 6, the lower support plate 1, and the intermediary member 8 are fixed with respect to the printed wiring board PB, one of the contact points of each of the contact terminals 20ai is pushed into the sleeves by way of the tips of the contact points touching the contact pads of the printed wiring board PB. Herewith, there is a danger that the upper support plate 6 can warp, as illustrated by the broken line, because the resultant counteractive force caused by the coil springs of each of the contact terminals 2ai acts upon the upper support plate 6.

Regarding the semiconductor device socket of the present invention described above, when mounting the semiconductor device DV in the semiconductor device mounting unit 14A of the positioning plate 14, the semiconductor device DV, which is held by a robot hand (not shown), is mounted in the semiconductor device mounting unit 14A, for example. Herewith, the electrodes DVa of the semiconductor device DV are positioned with respect to the contact points 20CT of the contact terminal. Thereafter, the semiconductor device DV is pushed down a prescribed distance against the biasing force of the coil springs of the contact terminals by the robot hand, and held.

Next, in a predetermined climate, testing of the semiconductor device DV is executed by way of a predetermined detection signal being supplied through the printed wiring board PB and the contact terminal group to the semiconductor device DV.

Furthermore, in the case of replacing a used contact terminal 20ai with a new contact terminal, or when replacing a contact terminal along with signal line, power-supply line and ground line design changes, the upper housing 10, lower housing 12, and reinforcing plate 18 are first removed from the printed wiring board PB by way of removing the machine screw BS1 from the spring washer SW and the nut NU. Next, the lower housing 12 is removed from the upper housing 10. Herewith, the contact terminals 20ai are capable of being removed from the cells 10ai of the upper housing 10. Next, the new contact terminal 20ai is inserted into the cell 10ai of the upper housing 10. Thereafter, by way of once again attaching the upper housing 10, lower housing 12 and the reinforcement plate 18 to the printed wiring board PB via the spring washer SW, the Nut Nu and the machine screw BS1, as described above, replacement of a contact terminal 20ai is completed easily.

Figure 2:
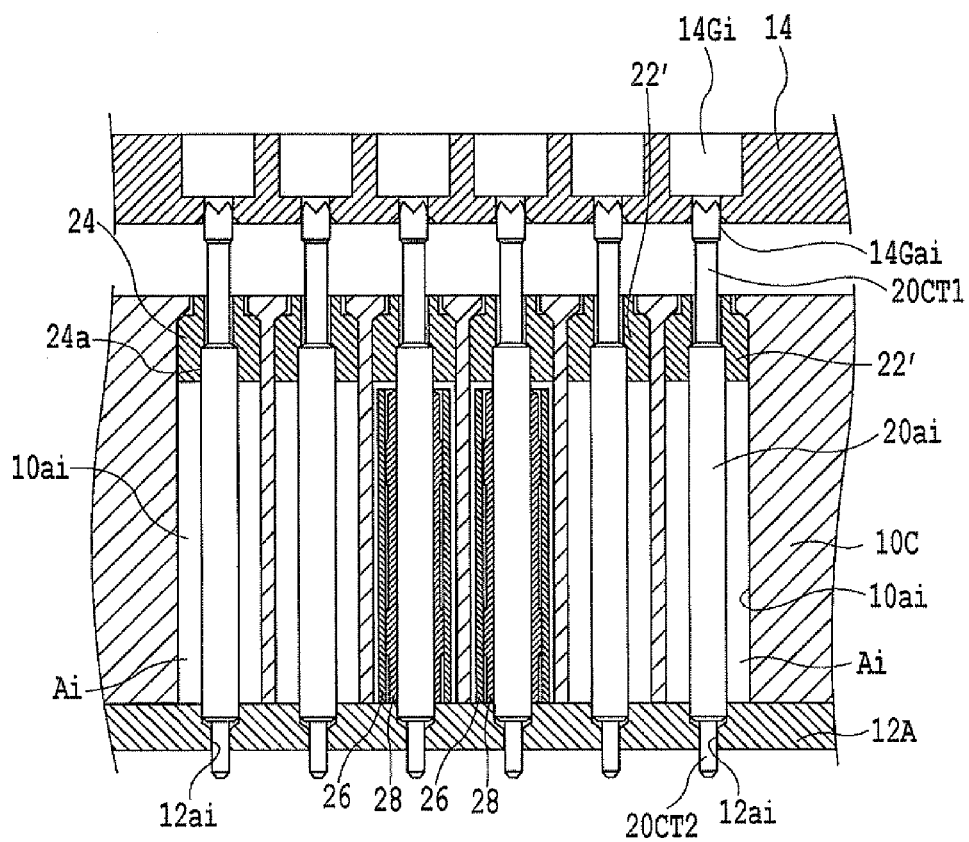
FIG. 2 is a partial cross sectional view illustrating main components of a variant of the example shown in FIG. 1.

Note that the length of the above described collar 22 is not limited to the examples above; for example, as enlarged in FIG. 2, the length of the collar 22' along its central axis may be set to a prescribed length that can support the contact point 20CT1 of the contact terminal 20ai, and the end of the sleeve 20S. The contact end 20CT of the contact terminal 20ai is inserted into the small diameter hole of the collar 22'. Herewith, the tip of the contact point 20CT1 of the contact terminal 20ai is inserted into the microscopic hole 14Gai of the positioning plate 14.

In the case above, an annular air layer Ai is formed at the lower region of the column 22' in the cell 10ai. Note that elements in the example shown in FIG. 2 that have the same structures as those of the example shown in FIG. 1, are marked with the same reference numbers, and duplicative explanation has been omitted.

In the embodiments shown in FIG. 1 and FIG. 2 it is possible to make the holes of the upper housing and the lower housing the same shape regardless of the type contact terminal. Thus there is no necessity of carrying out the creation of different contact receiving holes, or contact terminals to be used, according to the type of signal delivered to the contact terminal, and design, production and assembly are made easier. And, the above described adapters, collars, and tubes are parts that are capable of being standardized and increasing commonality, and it is possible to carry out their mass production in advance by way of high productivity metal molding techniques. Also with respect to the upper housing, it is possible to carry out the advance mass production of grid array, etc. standard pin device products by way of high productivity metal molding techniques.

Figure 7:
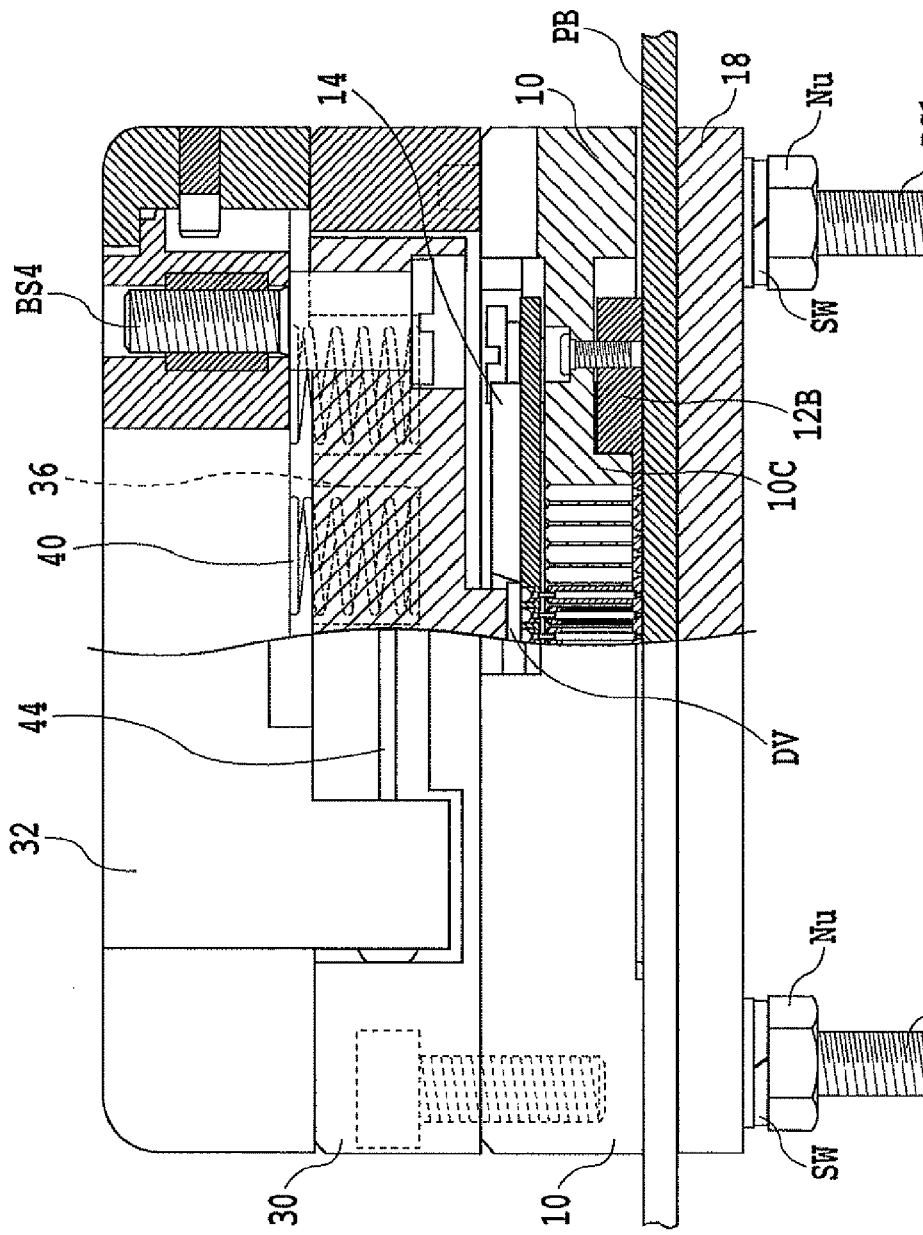
FIG. 7 is an external view that includes a partial cross sectional view illustrating main components of a semiconductor device of a second embodiment of the present invention.

FIG. 7 illustrates the main components of the semiconductor device socket of a second embodiment of the present invention.

Figure 9:
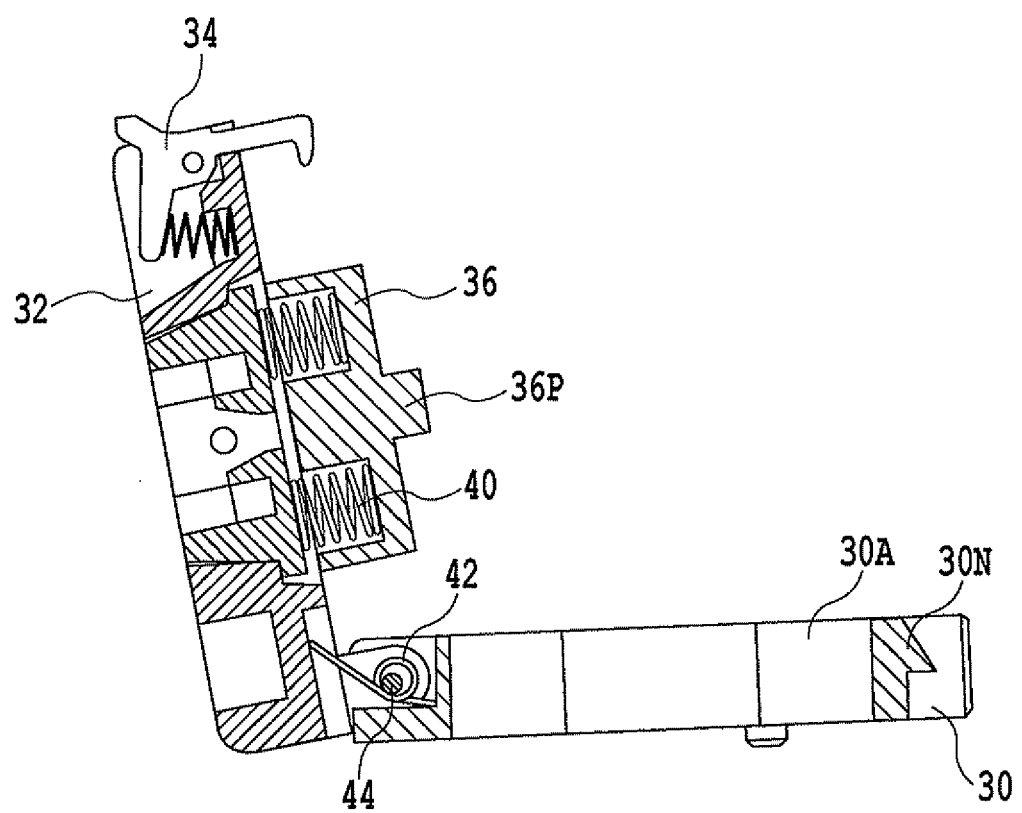
FIG. 9 is a front view illustrating a pressing unit provided in the example shown in FIG. 7.
Figure 10:
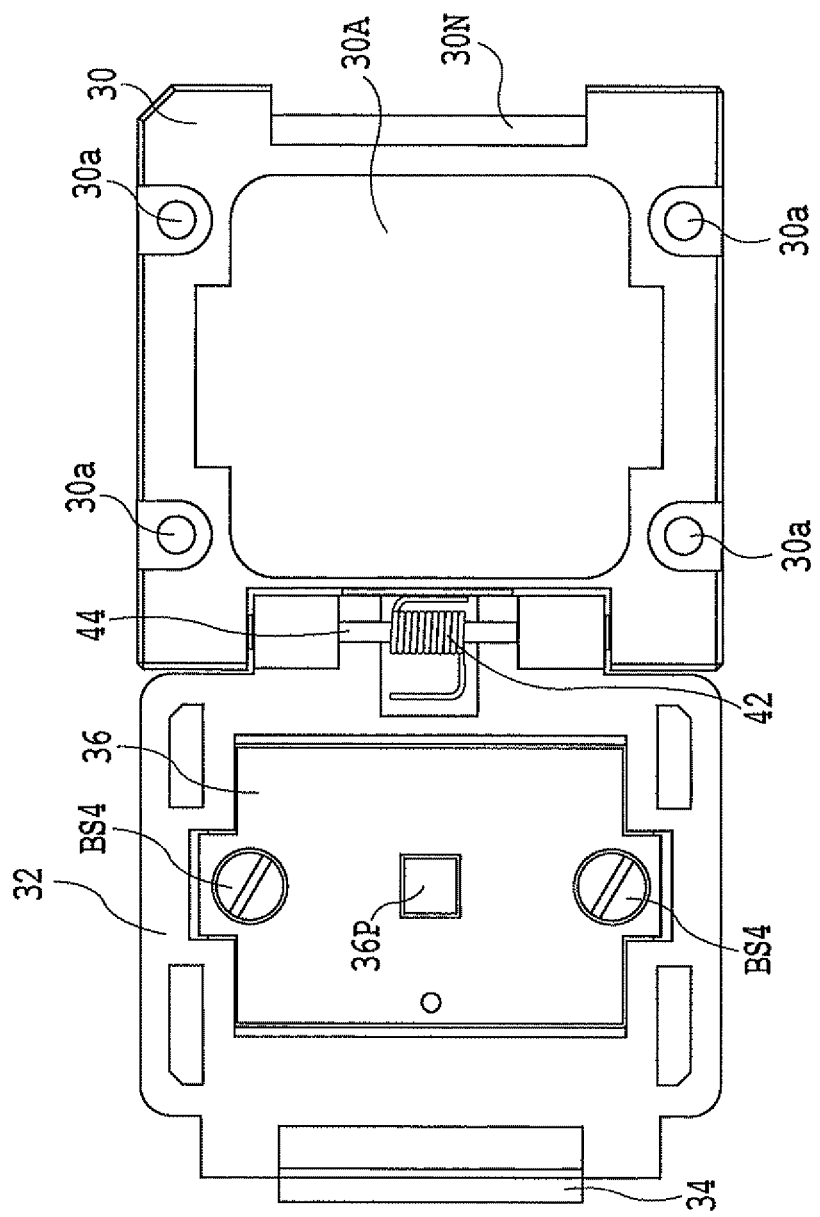
FIG. 10 is a plan view of the example shown in FIG. 9.

In the example illustrated at FIG. 7, in addition to the semiconductor device socket shown at FIG. 3, a so-called clam shell type pressing mechanism unit ("pressing unit"), such as that shown in FIGS. 9 and 10, is also provided.

Note that elements in the example shown in FIG. 7, and the other embodiments to be described later, that have the same structure as the example shown in FIG. 3 are marked with the same reference numbers, and duplicative explanation has been omitted.

In FIG. 7, the pressing unit, including the base member 30 and the lid member 32, are fixed to the upper end surface of the upper housing 10 described above. Thus it is possible to share the semiconductor device socket shown in FIG. 3 among IC sockets that are provided with a claim shell type pressing unit.

As shown in FIGS. 9 and 10, the pressing unit is configured to include a base member 30 mounted on the upper end surface of the upper housing, and a lid member 32 rotational moveably supported at an end of the base member 30. The lid member 32 has, such that it can rotate, a pressing body 36 that presses the electrode surface of amounted semiconductor device towards the contact terminal 20ai group described above.

The external dimensions of the base member 30 are such as to be approximately the same as the outer dimensions of the upper housing 10. An opening 30A, which is in communication with the semiconductor device mounting unit 14A of the positioning plate 14 described above, is formed at the central portion of the base member 30. Holes 30a, into which small fixation screws (not shown) are inserted, are respectively provided at the four corners on the perimeter of the opening 30A, and correspond to female threaded holes 10fs of the upper housing 10. Accordingly the base member 30 is attached to the upper housing 10 by way of the small fixation screws being screwed through the holes 30a into the female threaded holes 10fs.

The lid member 32 is rotational moveably supported at one end by the base member 30, through a support shaft 44. A torsion coil spring 42, which biases the other end of the lid member 32 towards a direction away from the base member 30, is wound around the support shaft 44. A latch member 34, which holds the lid member 32 to the base member 30 as shown in FIG. 7, and frees the lid member 32 as shown in FIG. 9, is rotational moveably provided at the other end of the lid member 32. An end of the latch member 34 is rotational moveably supported by the lid member 32, and the other end selectively engages the latch 30N of the base member 30. The latch member 34 is biased by a spring in the clockwise direction of FIG. 9.

The pressing body 36 is supported by the machine screws BS4, and movably provided inside a central opening on the inner surface of the lid member 32. The pressing body 36 is biased, by a plurality of coil springs 40 disposed inside its opening, in the direction in which its outer tip is separated away from the lid member 32. A pressing projection 36P is formed at the central portion of the pressing member 36.

With respect to the above configuration, when testing a semiconductor device, first, in the state shown in FIG. 9, the semiconductor device DV is passed through the opening 30A of the base member 30 and mounted on the semiconductor device mounting unit 14A of the positioning plate 14. Next, in a state where the lid member 32 is closed with respect to the opening 30A, as shown in FIG. 7, the semiconductor device DV is depressed towards and held with respect to the contact terminals 20ai, by the pressing projection 36P, as enlarged in FIG. 8. Predetermined tests are executed next.

Figure 11:
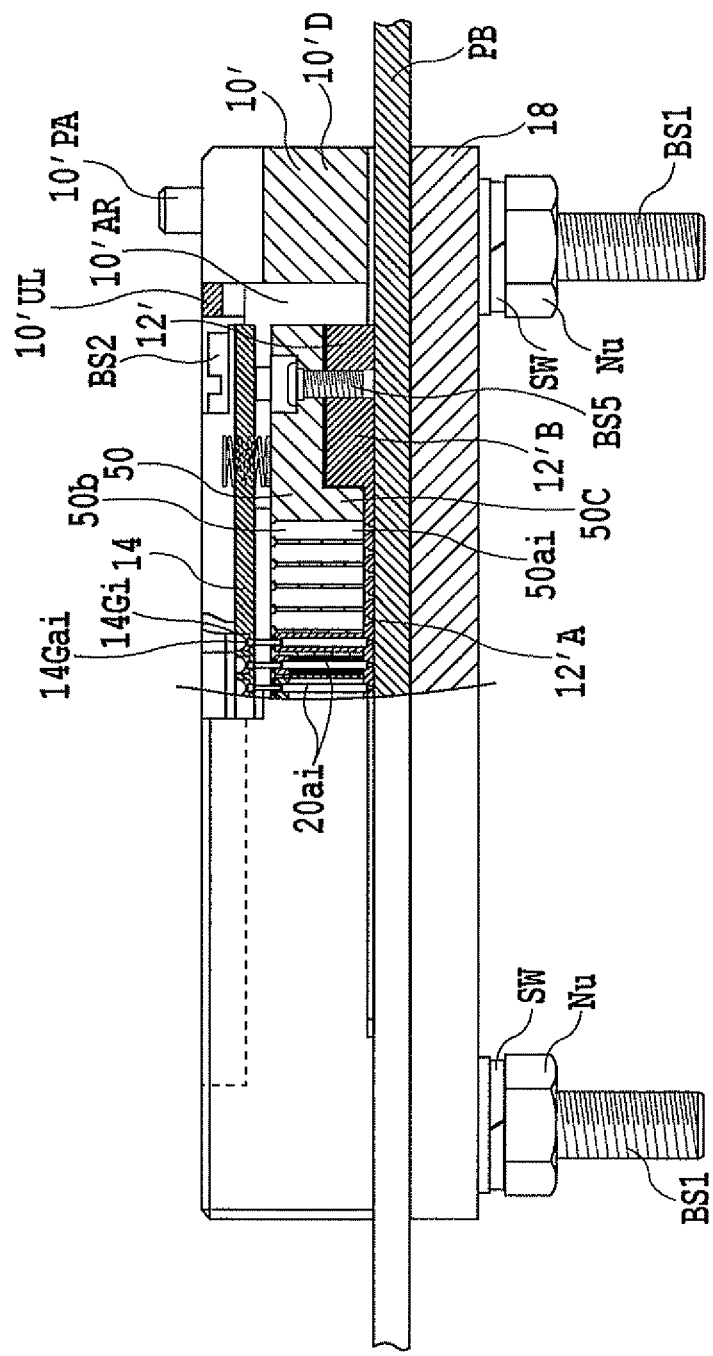
FIG. 11 is an exterior view that includes a partial cross sectional view along the line XI-XI shown in FIG. 12, illustrating main components of a semiconductor device socket of a third embodiment of the present invention.

FIG. 11 illustrates the main components of the semiconductor device socket of a third embodiment of the present invention.

In contrast to the first embodiment shown in FIG. 3, in which the contact terminal reception unit 10C of the upper housing 10 is integrally formed with the upper housing, in the embodiment shown in FIG. 11, a later described contact terminal cartridge, which has a contact terminal reception unit, is detachably disposed on a housing 10' that comprises an upper lid 10'UL and a base member 10'D, which mutually fit. Note that elements in the example shown at FIGS. 11, 12 and 13 that have the same structure as those of the example shown in FIG. 3 are marked with the same reference numbers, and duplicative explanation has been omitted.

The semiconductor device socket is configured to have as main elements (i) a contact terminal cartridge comprising an upper housing 50 and a lower housing 12', (ii) a positioning plate 14 that positions the respective electrodes DVa of the semiconductor device DV mounted with respect to the contact points of the respective contact terminals 20ai, and (iii) a reinforcing board 18 that sandwiches the printed wire board PB along with the upper housing 10 and the contact terminal cartridge. The upper housing 50 and the lower housing 12' act together to house therein the contact terminals 20ai (i=1 to n, where n is a positive integer) disposed above the printed wiring board PB.

Figure 13:
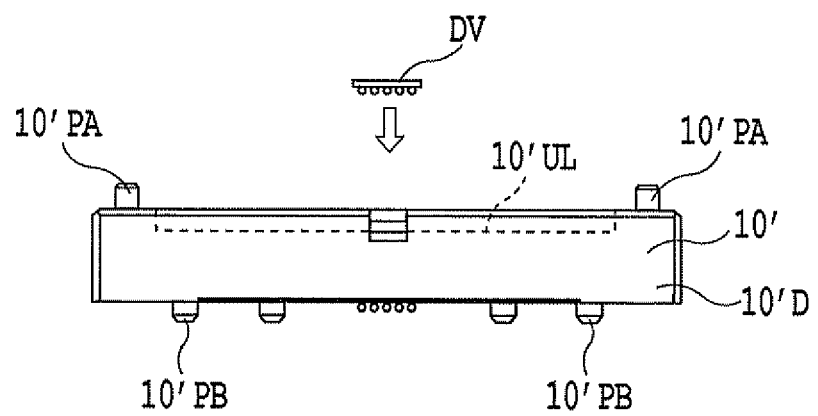
FIG. 13 is a front view showing the upper housing of the example illustrated in FIG. 11.

The upper lid member 10'UL and the base member 10'D of the housing 10' are made, respectively, from a conductive metallic material such as a copper or aluminum alloy, for example, and from an insulating material such as polyimide resin or polyether ether ketone resin (PEEK), for example. The base member 10'D of the housing 10', as shown in FIG. 11, has an opening 10'AR roughly at its center, in which the contact terminal cartridge is detachably disposed. As shown in FIG. 13, multiple positioning pins 10'PB are formed, at a prescribed distance, on the bottom surface of the base member 10'D of the housing 10'.

At the location of each of the 4 corners at the perimeter outside the opening 10'AR of the base member 10'D, through-holes are formed into which the heads of the machine screws BS1 are inserted. Between mutually facing pairs of through-holes 10a', crossing shallow channels are roughly formed into a cross shape, which channels are used when confirming, by a sensor, etc., whether the respective semiconductor devices DV are mounted in the semiconductor device mounting unit 14A.

Between the channels and the through-holes 10'a, female threaded holes 10'fs, into which later described machine screws are screwed, are formed along one of the oppositely facing sides of the base member 10'D. Furthermore, positioning pins 10'PA, which are fit into holes of the base member 30, are provided adjacent to the channels at one of the mutually facing sides of the base member 10'D of the housing 10'.

The perimeter of the upper lid member 10'UL that covers the upper edge of the later described contact terminal cartridge, is disposed inside the opening 10'AR with a predetermined gap therebetween. The upper lid member 10'UL has an opening at its central portion to which the positioning plate 14 is exposed.

Through-holes are formed at each of the corners of the upper lid member 10'UL. At the through-holes, as shown in FIG. 12, machine screws BS6, which are screwed through the upper lid member 10'UL and the contact terminal cartridge into the female threaded holes of the base member 10'D, are inserted.

Figure 12:
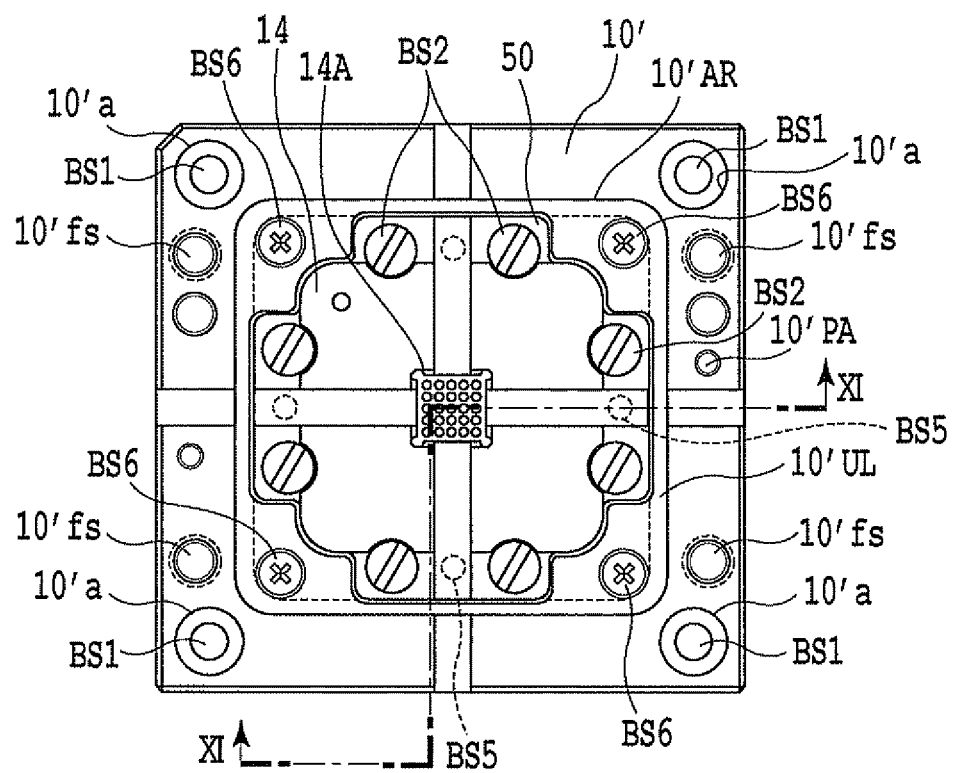
FIG. 12 is a plan view of the example shown in FIG. 11.

As shown in FIGS. 11 and 12, the contact terminal cartridge is disposed at a prescribed distance with respect to the inner surface that forms the opening 10'AR, and is configured to include an upper housing 50 and a lower housing 12'. At the bottom that forms the perimeter of the contact terminal reception unit 50C of the upper housing 50C, a concave portion is open, into which the connection portion of the lower housing 12' is inserted.

The lower housing 12' is formed out of a resin material, for example, and is composed of a connection portion 12'B that is inserted into the above mentioned concave portion, and a contact terminal alignment portion 12'A that extends from the connection portion 12'B and touches the bottom of the contact terminal reception unit 50C of the upper housing 50.

The connection portion 12'B of the lower housing 12' has a female threaded hole into which the machine screw BS5 is screwed. Accordingly, as shown at FIG. 11, the contact terminal cartridge is integrated by way of the machine screw BS5 being screwed through the hole of the upper housing 50 into the female threaded hole of the lower housing 12'. And, the integrated contact terminal cartridge is fixed to the base member 10'D by way of the above mentioned four machine screws BS6 being passed through through-holes (not shown) of the upper lid member 10'UL and holes (not shown) of the contact terminal cartridge into female threaded holes of the base member 10'D. Thus, the contact terminal cartridge, a part of which is covered by the upper lid member 10'UL, is fixed inside the opening 10'AR of the base member 10'D above the printed wiring board PB.

The contact terminal alignment portion 12'A has a plurality of through-holes that correspond to the cells 50ai (i=1 to n, where n is a positive integer) of the contact terminal reception unit 50C. Each through-hole 12ai is composed of a large diameter portion that receives and stops the end of the sleeve 20S of the contact terminal 20ai, and a small diameter portion that extends the large diameter portion and through which the contact point 20CT of the contact terminal 20ai passes.

The cells 50ai are formed lengthwise and breadthwise in the contact terminal reception unit 50C of the upper housing 50, at a prescribed distance corresponding to the electrodes DVa of the semiconductor device DV. The center axes of each of the cells 50ai extend in an approximately vertical direction with respect to the surface of the contact terminal alignment unit 12'A. The lower ends of the cells 50ai are open towards the contact terminal alignment portion 12'A (the surface side of the printed wiring board PB), and the upper ends of the cells 50ai have microscopic holes 50b having a radius smaller than that of the central portion. Each of the roughly cylinder shaped cells 50ai have the same structure as each other.

And the contact terminals 50ai received in each of the cells 10ai also have the same structure as each other.

In FIG. 11, at each of the cells 50ai of the upper housing 50, the contact terminals 20ai comprise, for example parts of the transmission paths of 2 signal lines, 2 power lines, and 2 ground lines, that correspond to transmission paths of the electrodes DVa of the semiconductor device DV. The configurations of the adapter 24, the combination tube, and collar 22, which are used along with each of the contact terminals 20ai at the signal lines, power lines, and ground lines, are respectively the same as that of the example shown at FIG. 1.

With respect to the above configuration, in the case where the upper housing 50 and the contact terminal cartridge comprising the lower housing 12, which accommodate each of the contact terminals 20ai, are fixed with respect to the printed wiring board PB, the contact points 20CT2 are pushed into the sleeves 20S by way of the tips of the contact points 20CT2 of each of the contact terminals 20ai touching the contact pads of the printed wiring board PB. Accordingly, because the resultant counteractive force caused by the coil springs of each of the contact terminals 20ai is caught at the entire body of the upper housing 50, there is no fear that warping of the upper housing 50 will occur due to the resultant counteractive force caused by the coil springs, and thus the positional accuracy of each of the contact terminals 20ai is maintained at a comparatively high precision.

And, in the case of replacing a used contact terminal 20ai with a new contact terminal, or when replacing a contact terminal along with signal line, power line and ground line design change, the contact terminal cartridge is first removed from the base member 10'D of the housing 10' above the printed wiring board, by way of removing upper lid member 10'UL. Next, the lower housing 12' is removed from the upper housing 50. Accordingly the contact terminals 20ai are capable of being removed from the cells 50ai of the upper housing 50. After the new contact terminal 20ai has been inserted into the cell 50*ai* of the upper housing 50, replacement of the contact terminal is completed easily by way of the contact terminal cartridge, mutually assembled with the upper housing 50 and lower housing 12', being fixed again to the housing 10' above the printed wiring board PB, and by way of the upper lid member 10'UL being fixed, through the contact terminal cartridge, with respect to the base member 10'D, as described above.

Figure 14:
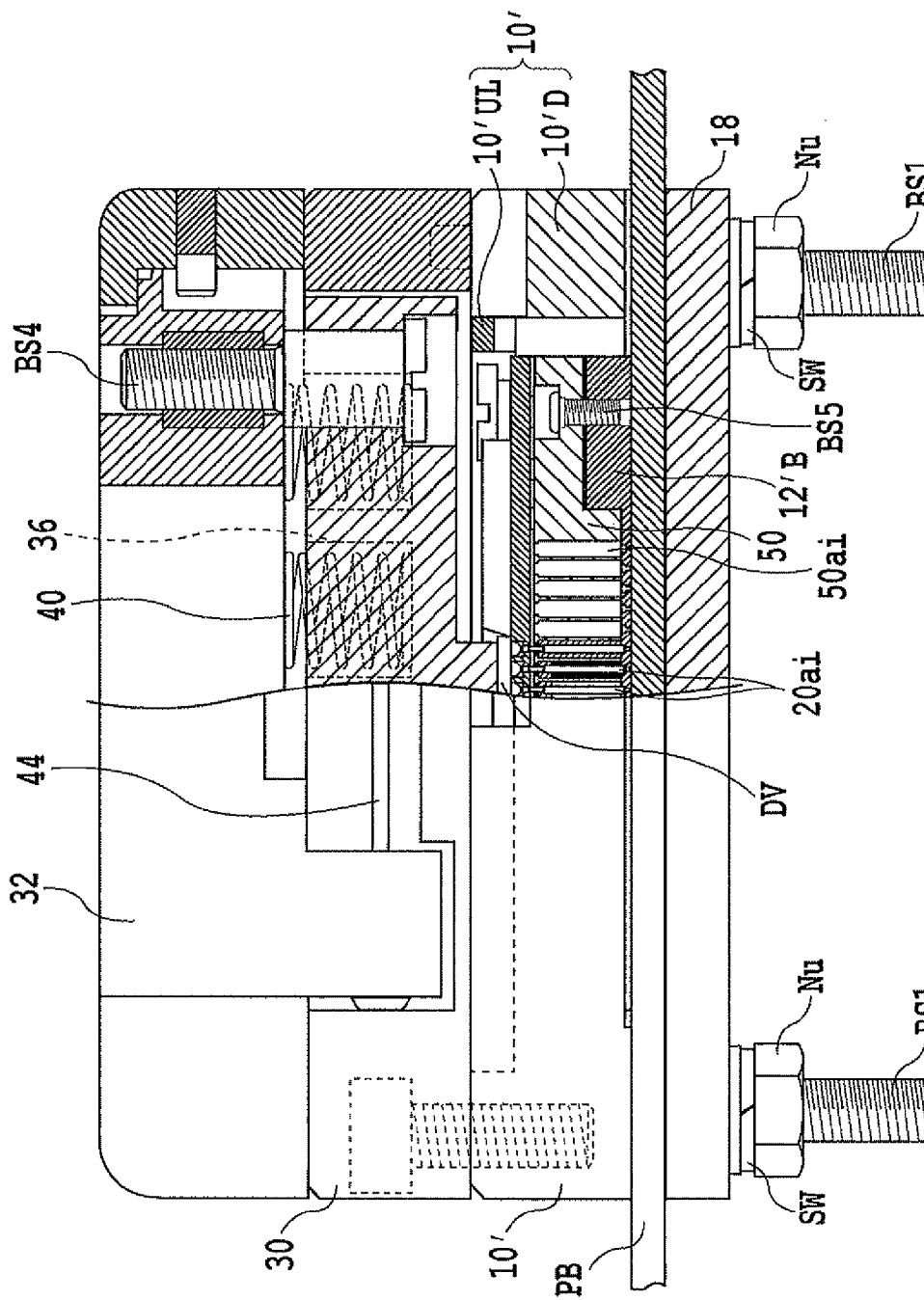
FIG. 14 is an external view that includes a partial cross sectional view illustrating main components of a semiconductor device of a fourth embodiment of the present invention.

FIG. 14 illustrates the main components of the semiconductor device socket of a fourth embodiment of the invention.

In the example illustrated at FIG. 14, in addition to the semiconductor device socket shown at FIG. 11, a so-called clam shell type pressing mechanism unit, such as that of the above described example shown at FIGS. 9 and 10, is also provided.

Note that elements in the example of FIG. 14 that have the same structures as those shown in the example of FIGS. 9, 10 and 11, are marked with the same reference numbers, and duplicative explanation has been omitted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A socket for a semiconductor device comprising:
   a plurality of contact terminals that have the same structure as each other and connect to signal lines and ground lines of the semiconductor device;
   an upper housing that is made from a conductive material and that is provided with a contact terminal reception unit that has a plurality of open ends through which said contact terminals pass and a plurality of contact terminal cells that form air layers that set an impedance at the peripheries of said contact terminals that correspond to said signal lines, when said contact terminals are separately received and said contact terminals that correspond to said signal lines are received;
   a lower housing that is made from an electrically insulating material, is disposed in said upper housing such as to cover the open ends of said contact terminal reception unit, and which has holes that correspond to said contact terminal cells and into which ends of said contact terminals are inserted;
   conductive collar members that are disposed such as to touch an inner surface, between an outer surface of said contact terminals and the inner surfaces of said contact terminals cells, of the contact terminal cells corresponding to said ground lines: and
   adapters that set the impedance of the contact terminal cells corresponding to said signal lines along with the relative permittivity of said air layers, and having electrically insulating properties and positioning said contact terminals between the outer surfaces of said contact terminals and the inner surfaces of said contact terminal cells.

2. The socket for a semiconductor device according to claim 1, comprising insulating layers facing said inner surfaces of said contact terminal cells, and conductive members covered by said insulating layers, in the contact terminal cells corresponding to power-supply lines of said semiconductor device.

3. The socket for a semiconductor device according to claim 1, wherein said upper housing is formed by a metallic material having a strength that is greater than a material strength of said lower housing, and wherein the thickness along the central axis of the contact terminals that are disposed in the contact terminal cells of said upper housing is set larger than the thickness of said lower housing.

4. The socket for a semiconductor device according to claim 1, wherein said semiconductor device is detachably disposed on a semiconductor device mounting unit of a positioning plate that is disposed facing an end surface of said upper housing.

5. The socket for a semiconductor device according to claim 2, wherein said upper housing is formed by a metallic material having a strength that is greater than a material strength of said lower housing, and wherein the thickness along the central axis of the contact terminals that are disposed in the contact terminal cells of said upper housing is set larger than the thickness of said lower housing.

6. The socket for a semiconductor device according to claim 2, wherein said semiconductor device is detachably disposed on a semiconductor device mounting unit of a positioning plate that is disposed facing an end surface of said upper housing.

7. The socket for a semiconductor device according to claim 3, wherein said semiconductor device is detachably disposed on a semiconductor device mounting unit of a positioning plate that is disposed facing an end surface of said upper housing.

* * * * *